US008843696B2

(12) United States Patent
Hasegawa

(10) Patent No.: US 8,843,696 B2
(45) Date of Patent: Sep. 23, 2014

(54) MEMORY DEVICE AND METHOD OF CONTROLLING THE SAME

(75) Inventor: Misao Hasegawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 199 days.

(21) Appl. No.: 13/427,252

(22) Filed: Mar. 22, 2012

(65) Prior Publication Data

US 2013/0073795 A1   Mar. 21, 2013

(30) Foreign Application Priority Data

Sep. 21, 2011 (JP) ................................. 2011-206227

(51) Int. Cl.
| | | |
|---|---|---|
| G06F 12/00 | (2006.01) | |
| G06F 13/16 | (2006.01) | |
| G06F 12/02 | (2006.01) | |
| G06F 3/06 | (2006.01) | |
| G11C 16/00 | (2006.01) | |

(52) U.S. Cl.
CPC ............ *G06F 13/16* (2013.01); *G06F 12/0238* (2013.01); *G06F 3/0679* (2013.01); *G06F 3/0688* (2013.01); *G06F 12/0246* (2013.01); *G11C 16/00* (2013.01)
USPC ........... 711/103; 711/100; 711/115; 711/154; 711/170; 711/173; 711/E12.001

(58) Field of Classification Search
USPC ................. 711/100, 103, 115, 154, 170, 173, 711/E12.001
See application file for complete search history.

(56) References Cited

U.S. PATENT DOCUMENTS

| 7,926,720 B2 | 4/2011 | Elhamias et al. |
| 2009/0307427 A1 | 12/2009 | Takasuka et al. |
| 2013/0024747 A1* | 1/2013 | Sharon et al. ................. 714/773 |

FOREIGN PATENT DOCUMENTS

| JP | 6-324937 A | 11/1994 |
| JP | 7-105071 A | 4/1995 |
| TW | 2011-28397 A1 | 8/2011 |
| WO | WO 2007/116476 A1 | 10/2007 |

OTHER PUBLICATIONS

JEDEC Standard, "Universal Flash Storage (UFS)", JESD220, JEDEC Solid State Technology Association, Jedec Standard No. 220, Feb. 2011, 257 pages.
Office Action issued Jan. 28, 2014 in Japanese Patent Application No. 2011-206227 (with English language translation).
Office Action issued on Mar. 25, 2014 in Taiwanese Patent Application No. 101107523 (with English Translation).

* cited by examiner

*Primary Examiner* — Midys Rojas
(74) *Attorney, Agent, or Firm* — Oblon, Spivak, McClelland, Maier & Neustadt, L.L.P.

(57) ABSTRACT

According to one embodiment, a memory device includes a nonvolatile memory in which data write or data read is executed in units of a plurality of cells, and a controller configured to control the memory and to manage a memory space of the memory by dividing the memory space into a plurality of partitions.

16 Claims, 14 Drawing Sheets

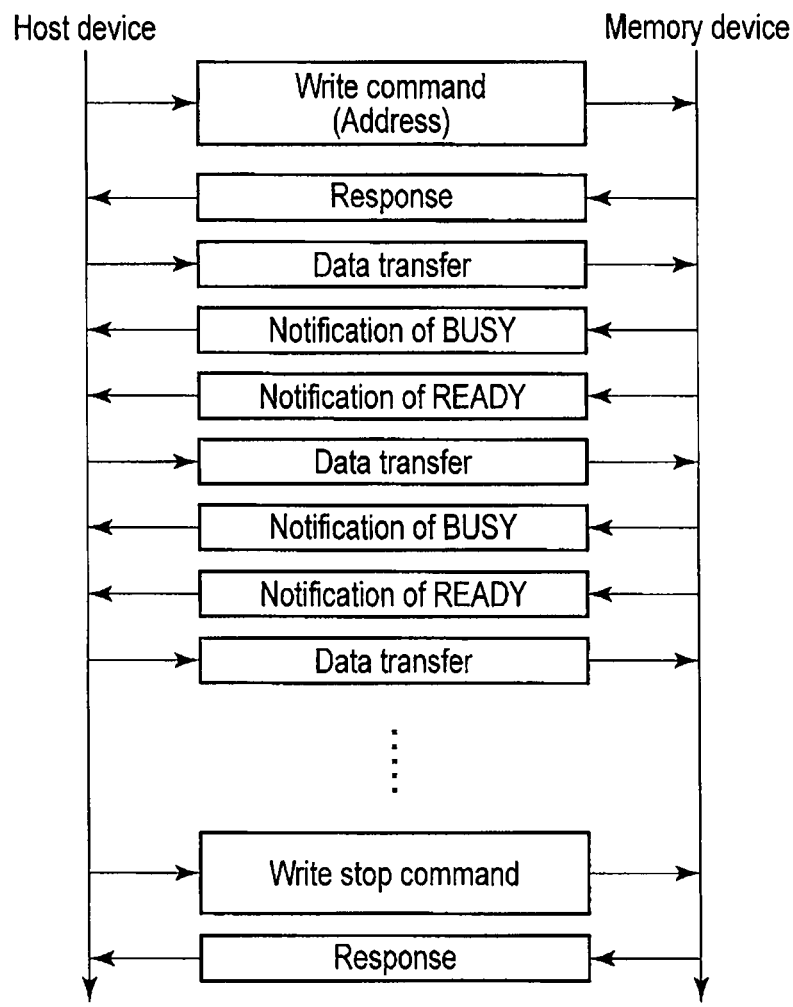
F I G. 1

Reference example

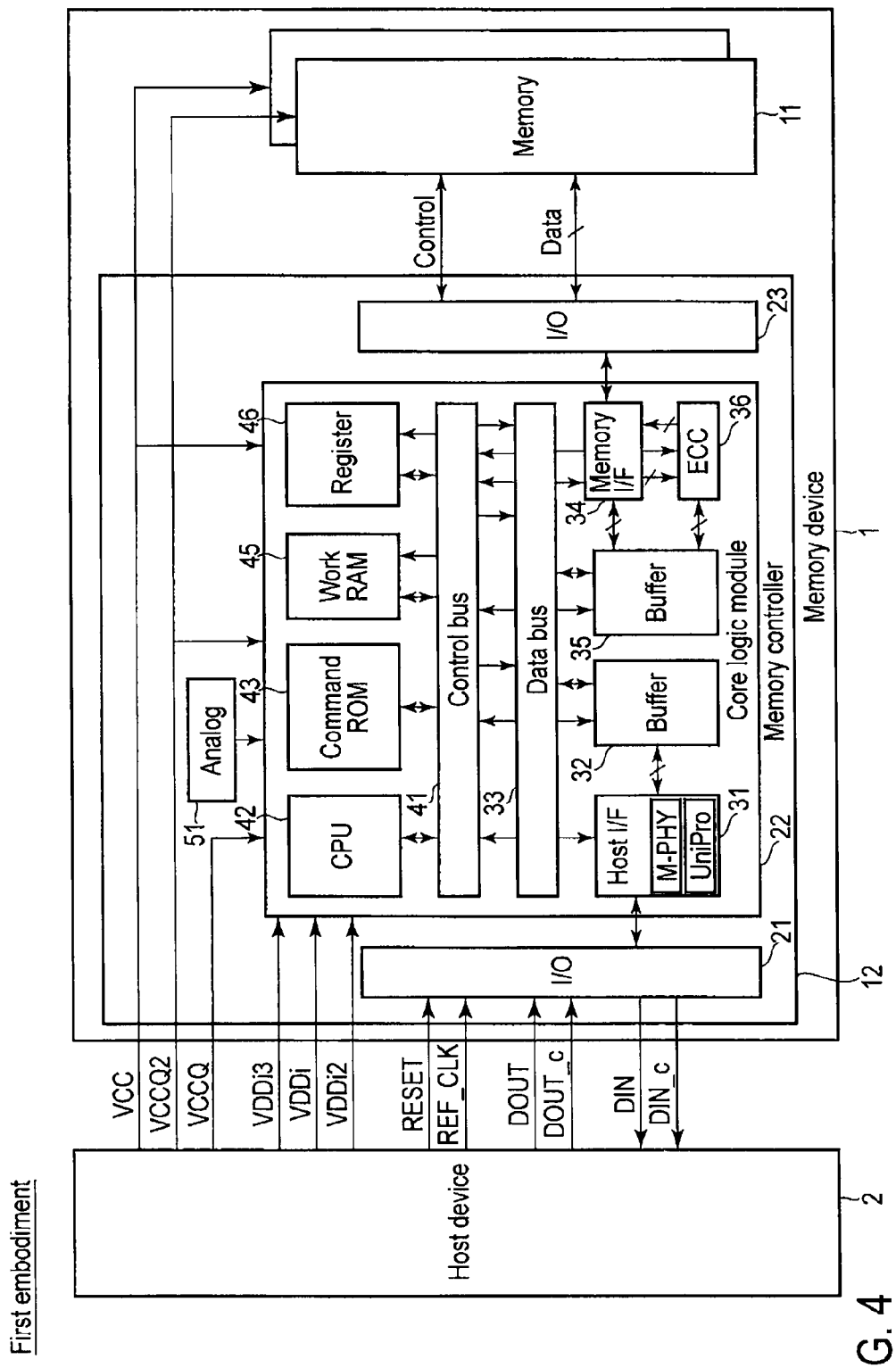
F I G. 4

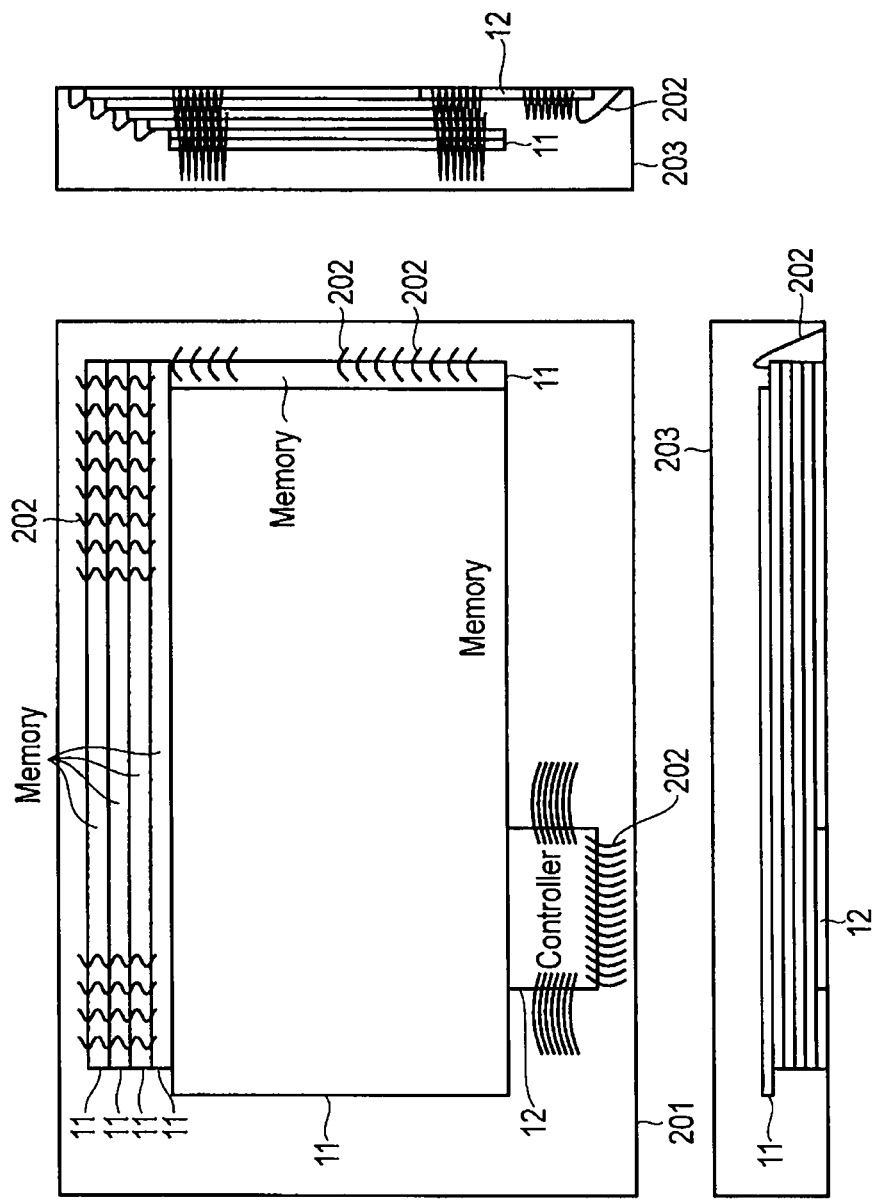
F I G. 5

| Logical address | Physical (block) address |
|---|---|
| 0x0000_0x0FFF | 0x0001 |
| 0x1000_0x1FFF | 0x0005 |
| 0x2000_0x2FFF | 0x0100 |
| 0x3000_0x3FFF | 0x0A00 |
| 0x4000_0x4FFF | 0x0003 |
| 0x5000_0x5FFF | 0x0123 |
| ... | ... |

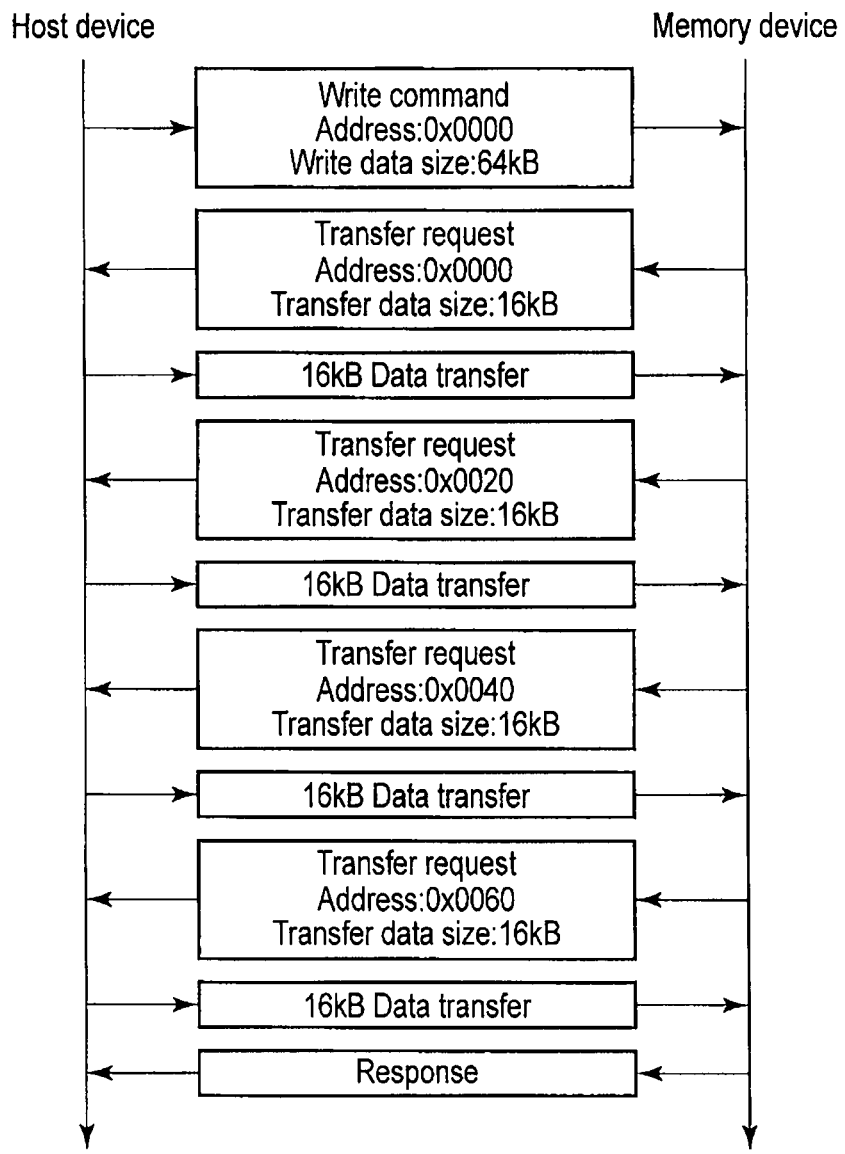
F I G. 10

Write command
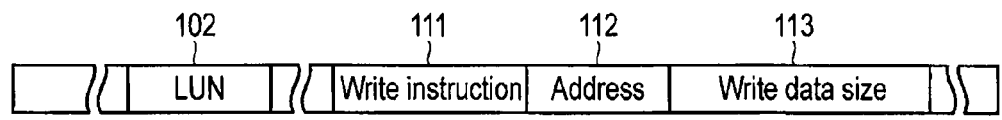
F I G. 1 1
Transfer request
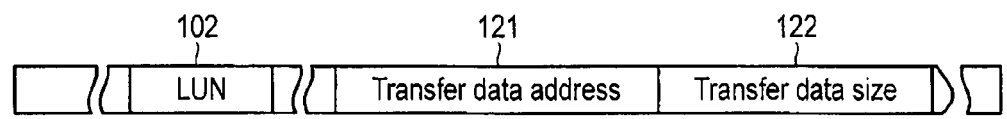
F I G. 1 2
Data transfer
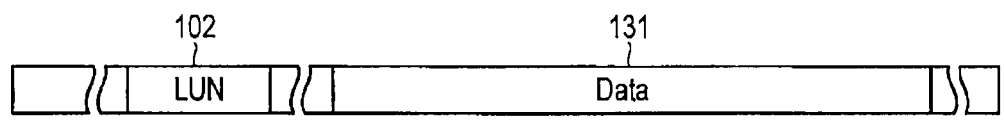
F I G. 1 3

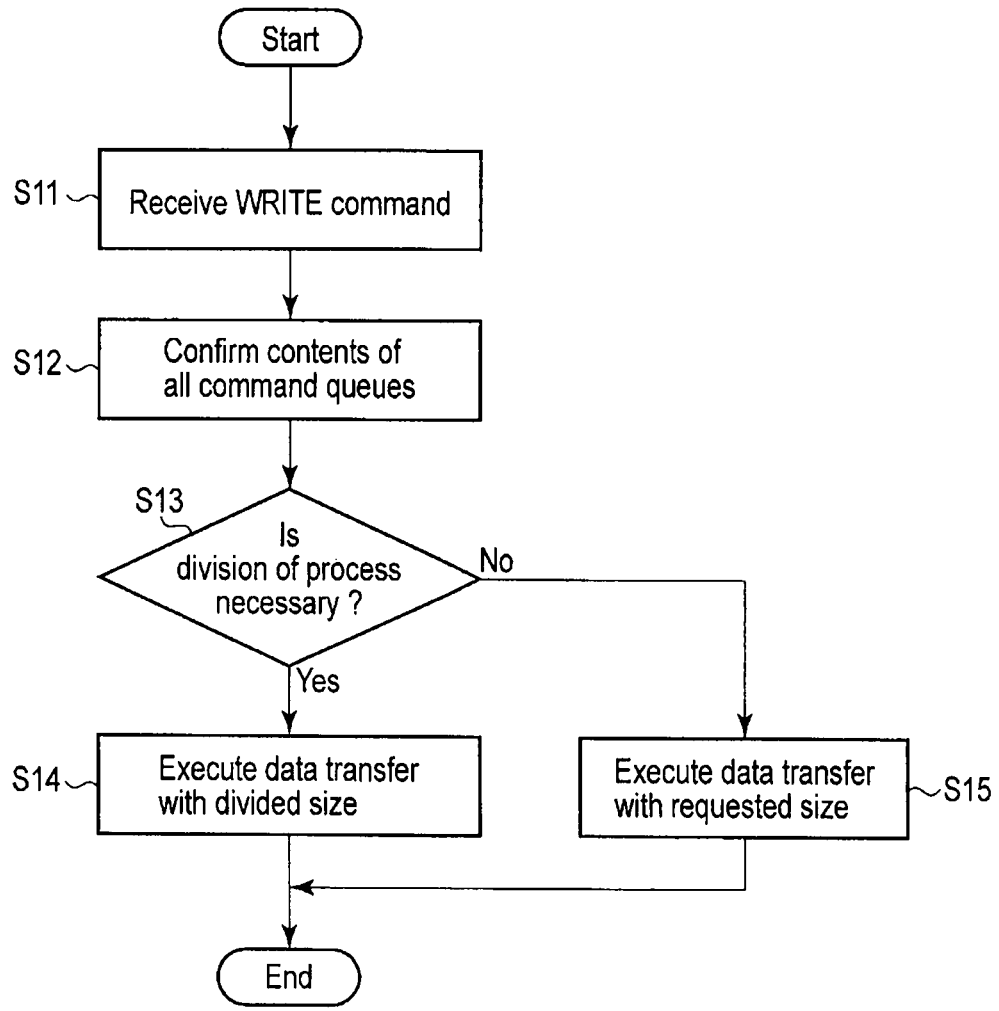
F I G. 14

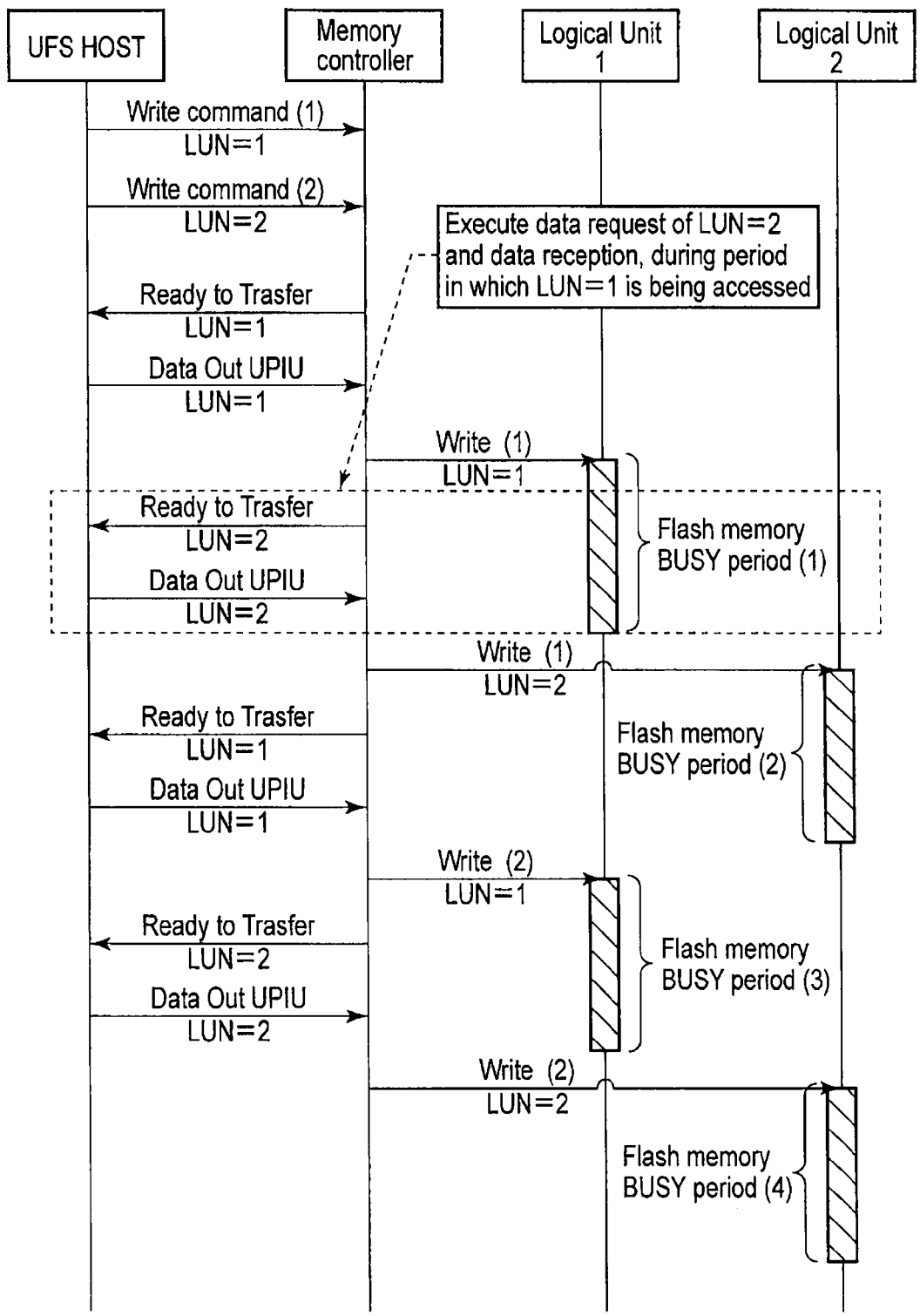
F I G. 15

MEMORY DEVICE AND METHOD OF CONTROLLING THE SAME

CROSS-REFERENCE TO RELATED APPLICATIONS

This application is based upon and claims the benefit of priority from prior Japanese Patent Application No. 2011-206227, filed Sep. 21, 2011, the entire contents of which are incorporated herein by reference.

FIELD

Embodiments described herein relate generally to a memory device and a method of controlling the memory device.

BACKGROUND

There are various kinds of media which store data. Such media include, for instance, a memory device based on a client/server model. A memory system, which is composed of a memory device and a host device based on the client/server model, is different from other memory systems in some points. For example, the assignment of roles to the memory device and host device based on the client/server model is different from the assignment of roles to a memory device and a host device which are not based on the client/server model. Accordingly, the contents of communications between the host device and memory device differ between the system based on the client/server model and the system not based on the client/server model.

In some cases, a memory system accords with a specific standard. An example of the memory system based on the client/server model is a UFS (Universal Flash Storage) memory device and host device. As regards points specified in the standard, the memory system must accord with specifications. However, there are points which are not specified in the standard, and a designer of the memory system can decide on such points. Such items with a degree of freedom should be determined so that desirable capabilities may be realized in a manner to adapt to the characteristics of the memory system. There has been a demand that a memory device, which can realize higher capabilities, be provided by making proper decisions on such matters with a degree of freedom.

BRIEF DESCRIPTION OF THE DRAWINGS

FIG. 1 is a view illustrating an example of communication between a memory device and a host device at a time of writing data;

FIG. 4 is a view illustrating a hardware structure of a memory device according to a first embodiment;

FIG. 5 is a view illustrating an example of the memory device in a sealed form;

FIG. 10 is a view illustrating communication at a time of data write in the first embodiment;

FIG. 11 is a view illustrating an example of a write command;

FIG. 12 is a view illustrating an example of contents of communication for a transfer request;

FIG. 13 is a view illustrating an example of contents of communication for data transfer;

FIG. 14 is a view illustrating a data division determination flow of the memory device according to the first embodiment;

FIG. 15 is a view illustrating more concretely the data division of the memory device according to the first embodiment;

DETAILED DESCRIPTION

Figure 2:
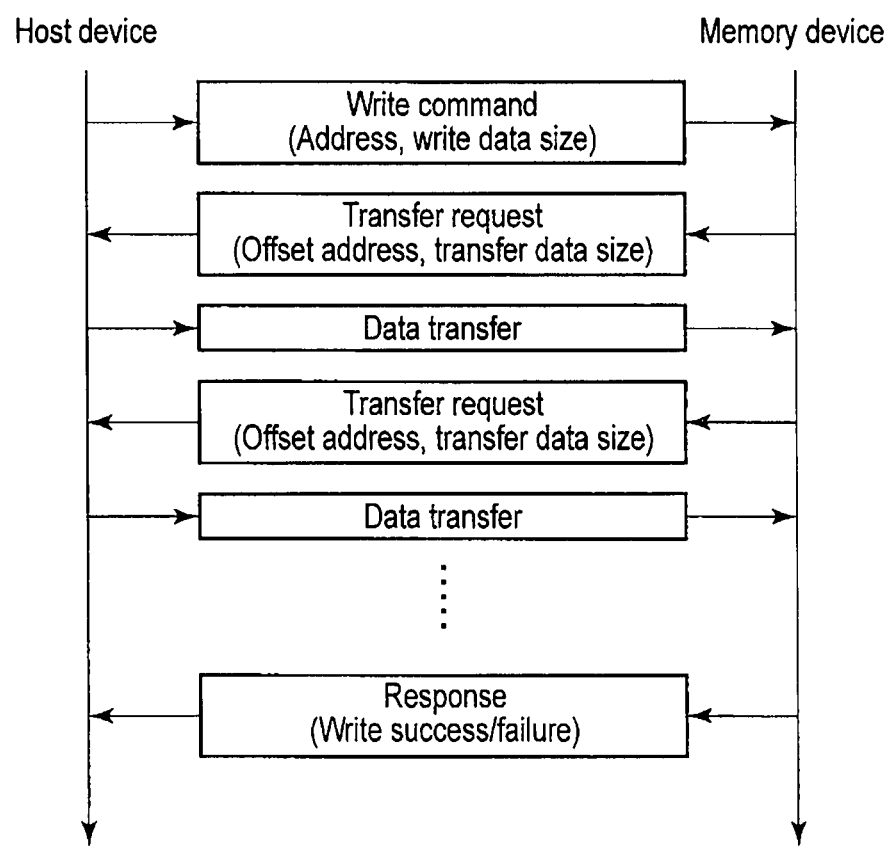
FIG. 2 is a view illustrating an example of communication between a memory device and a host device, which are based on a client/server model according to a reference example, at a time of writing data.

In general, according to one embodiment, a memory device includes a nonvolatile memory in which data write or data read is executed in units of a plurality of cells, and a controller configured to control the memory and to manage a memory space of the memory by dividing the memory space into a plurality of partitions. The controller is configured to divide a data size of write data when a data write request has been issued, and to issue a request for write data of a second partition of the plurality of divided partitions and receive the write data, during a period in which data write of a first partition of the plurality of divided partitions is being executed.

REFERENCE EXAMPLE

Prior to the description of embodiments, a reference example will be described in brief. A description is given of, as the reference example, a memory system, which is based on the client/server model, and a memory system, which is not based on the client/server model. An SD™ card and an eMMC are taken as examples of the memory device which is not based on the client/server model.

FIG. 1 illustrates an example of communication between a memory device (SD™ card or an eMMC) and a host device at a time of writing data. As shown in FIG. 1, the host device starts data write by issuing a write command. The write command includes a logical address which is allocated to write data. The logical address corresponds to a start position of the write data. Upon receiving the write command, the memory device returns a response. Upon receiving the response, the host device transfers data (write data) which is to be written in the memory device. The write data is transferred in the state in which the write data is divided into a plurality of write data parts. The size of the write data part is predetermined based on the standard of the SD™ card or the eMMC. While the memory device can receive data, the memory device notifies a ready state by using a ready/busy signal. The memory device successively writes the received data in a memory in the memory device. On the other hand, if the memory device can no longer receive data, for example, because a buffer in the memory device has become full, the memory device notifies the busy state to the host device. While the memory device is in the busy state, the host device suspends the transfer of data. If the busy state is released, the host device transmits subsequent write data parts. In this manner, if the whole write data has been transmitted, the host device transmits a write stop command. Upon receiving the write stop command, the memory device returns a response, and the data write is completed.

As described above, the position of write of data is designated by the host device, and the size of the write data part is determined by the standard. Specifically, in the memory system of the reference example, the host device has the initiative of data transfer. The host device issues an instruction to the memory device, and the memory device follows the instruction. The degree of freedom, which is possessed by the memory device, is small.

FIG. 2 illustrates an example of communication between a memory device and a host device, which are based on the client/server model at a time of writing data. As shown in FIG. 2, the host device starts data write by issuing a write command. The write command includes a logical address designating a position of data write, and information indicative of the size of write data which is a target of the write command. Upon receiving the write command, the memory device determines the content of a transfer request for the write data. The transfer request includes the size of that part of the write data, which the memory device desires the host device to transfer, and an offset address. The offset address is an address for specifying the position of the data part, the transfer of which is desired by the memory device. Upon receiving the transfer request, the host device transfers the requested data part to the memory device. The memory device executes write of the received data part, and transmission of a transfer request for other data parts. The data write and transfer request are continued until the whole write data has been written. In accordance with the success/failure of write of the whole write data, the memory device transmits a corresponding response to the host device.

In this manner, in the example of FIG. 2, the memory device determines the write data part, and transmits the transfer request. As regards the data write, there are matters which are specified by the standard and matters which are not specified by the standard. For example, whether offset addresses in the transfer request by the memory device are sequential or random is arbitrarily set in the host device, and the selection of offset addresses must agree with this setting. On the other hand, for example, there is a case in which the size of the data part designated by the transfer request is not stipulated in the specifications.

<Re: Relationship Between Host Device and Memory Device>

Figure 3:
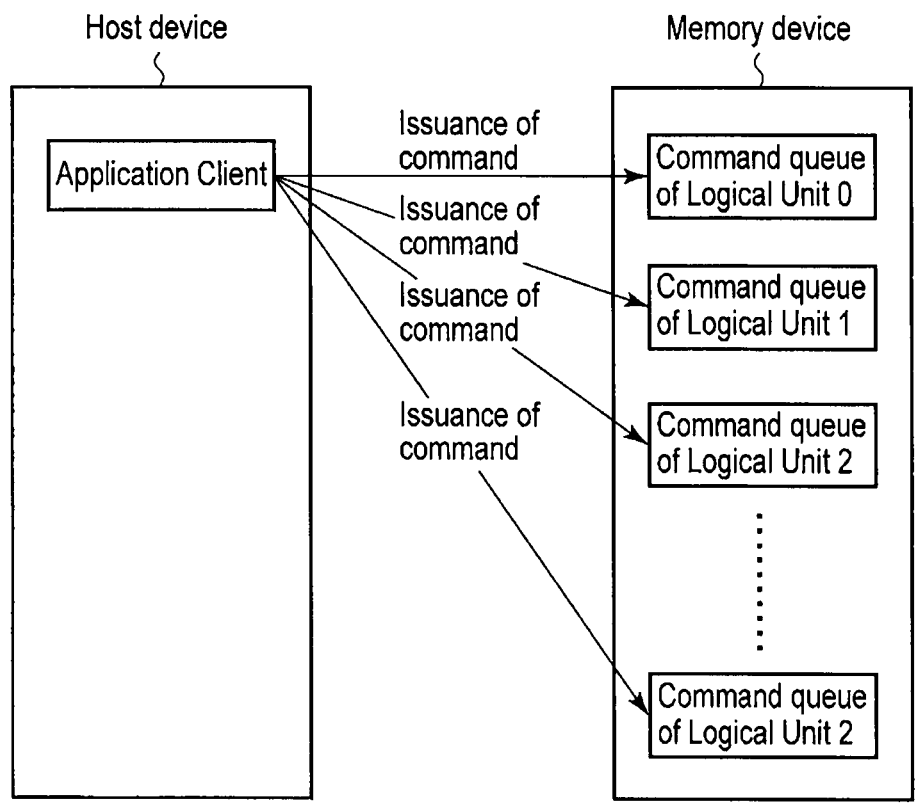
FIG. 3 is a view illustrating the host device and memory device according to the reference example.

Next, referring to FIG. 3, the relationship between the host device and memory device is explained in brief.

For example, in data write (WRITE process) which is standardized in the UFS, a logical block address and a length are designated from the host device. As regards data write to a NAND flash memory of the memory device itself, the memory device which has received this designation is not subject to restrictions as to whether data write is to be executed at a time or is to be executed dividedly at a plurality of times, and this matter can be handled for reasons on the memory device side.

As shown in FIG. 3, in the UFS, an application client (Application Client) in the host device can issue commands respectively to a plurality of logical units (Logical Unit) in the memory device. The commands which have been issued to the logical units are required to function independently. Specifically, it is necessary that the plural logical units appear to operate independently and in parallel, as viewed from the applicant client side.

However, in general, the access to the NAND flash memory requires a long time, compared to the processing time of the CPU. Thus, if access is required to large data in one logical unit, the operation of the other logical units is hindered, and parallel operations are disabled, leading to degradation in capability of response to the host device side.

On the other hand, restrictions to the minimum write size are imposed on the data write to the NAND flash memory which is included in the memory device. Thus, there is a feature that the performance of data write to the NAND flash memory becomes higher as the write size for one time write increases.

Next, embodiments, which are constructed based on the above knowledge, will be described with reference to the accompanying drawings. In the description below, structural elements having substantially the same function and structure are denoted by like reference numerals, and an overlapping description is given only where necessary. The following embodiments illustrate, by way of example, a device and a method for embodying the technical concept of these embodiments, and the technical concept does not specify the material, shape, structure or configuration of structural components. Various changes and modifications can be made to the technical concept of the embodiments, without departing from the scope of the claims.

[First Embodiment]

FIG. 4 schematically illustrates a memory device according to a first embodiment. FIG. 4 shows a hardware structure of the memory device. As shown in FIG. 4, the memory device 1 is configured to be able to communicate with a host device (hereinafter, in some cases, referred to simply as "host") 2. The memory device 1 and host 2 communicate, at least in such a manner that the memory device 1 can designate the size and position of a part of write data in response to a write request from the host 2. To be more specific, the memory device 1 and host 2 communicate, based on a client/server model. The memory device 1 operates as a target, and the host 2 operates as an initiator. In a more concrete example, the memory device 1 is a UFS memory device, and the host 2 is a host which supports the UFS memory device.

The memory device 1 includes, at least, a nonvolatile semiconductor memory 11, and a memory controller 12 for controlling the memory 11. The memory 11 executes data write and data read in units of a specific write unit comprising a plurality of bits. Further, the memory 11 executes data erase in units of an erase unit comprising a plurality of write units.

For example, the memory 11 is composed of one or plural NAND flash memories. When the memory 11 is a NAND flash memory, the memory 11 executes data write and read in units of a page. The page is composed of a memory space of a set of a plurality of memory cells whose gates are commonly coupled, and a unique physical address is allocated to the page.

The memory 11 includes a memory cell array comprising a plurality of memory cells, and a page buffer which executes data input/output from/to the memory cells. The page buffer stores data of one page. When data write to the memory 11 is executed, the memory controller 12 sends, as well as a write command, a page address indicating a location of data write, and write data for one page. The memory 11 stores in the page buffer the write data which has been received from the memory controller 12, and writes the write data in the page buffer into memory cells designated by the page address. When the write operation to the memory cells is started, the memory 11 outputs the controller 12 a busy signal indicating that the operation is being executed. When data is to be subsequently written, the same operation as describe above is executed at the next page address, after the busy signal is changed to a ready signal.

When data read from the memory 11 is executed, the memory controller 12 sends to the memory 11 a read-out command and a page address indicative of a location of data read. The memory 11 reads out data of one page from the memory cells designated by the page address to the page buffer. When the read operation from the memory cells is started, the memory 11 outputs a busy signal to the memory controller 12. After the busy signal is changed to a ready signal, the read data stored in the page buffer is output to the memory controller 11. When data is subsequently read out, the same operation as described above is executed at the next page address.

In the case where the memory 11 is a NAND flash memory, the memory 11 executes data erase in units of a block. Each block comprises a plurality of pages having sequential physical addresses. Each of the memory cells is a MOSFET (metal oxide semiconductor field effect transistor) having a stacked gate. In each of cell transistors, a threshold voltage varies in accordance with the number of electrons accumulated in a floating gate, and each cell transistor stores information corresponding to the threshold voltage. In the case where the memory 11 is the NAND flash memory, the cell transistor can take different states according to two or more threshold voltages. Specifically, the memory 11 may be configured such that the memory cell may store multiple values (multi-bits). In the description below, for the purpose of convenience, it is assumed that the write unit is a page and the erase unit is a block. However, the memory 11 is not necessarily limited to the NAND flash memory.

The memory device 1 includes an I/O 21, a core logic module 22, and an I/O 23. The I/O 21 includes a hardware structure for the memory device 1 to establish a connection to the host 2. In the case where the memory device 1 is the UFS memory device, signals between the memory device 1 and the host 2 include RESET, REF_CLK, DOUT, DOUT_c, DIN, DIN_c, VCC, VCCQ, VCCQ2, VDDi, VDDi2, and VDDi3. The RESET, REF_CLK, DOUT, DOUT_c, DIN, and DIN_c are communicated between the host 2 and the I/O 21. The RESET is a hardware reset signal. The REF_CLK is a reference clock. The DOUT and DOUT_c constitute a differential signal pair, and are signals which are sent from the host 2 to the memory device 1. The DIN and DIN_c constitute a differential signal pair, and are signals which are sent from the memory device 1 to the host 2. The VCC, VCCQ and VCCQ2 are power supply voltages which are supplied to the memory 11 and the core logic module 22. The VDDi, VDDi2, and VDDi3 are supplied to the core logic module 22, and serve as an input terminal in a case where a voltage regulator is provided in the core logic module 22.

The core logic module 22 is a main part of the memory controller 12, excluding the I/O. The I/O 23 includes a hardware structure for the memory controller 12 to establish a connection to the memory 11. The core logic module 22 includes a host interface 31, a buffer 32, a data bus 33, a memory interface 34, a buffer 35, an ECC circuit 36, a control bus 41, a CPU 42, a ROM 43, a work RAM 45, and a register 46.

The I/O 21 is connected to the host interface 31. The host interface 31 executes a process which is necessary for communication between the memory device 1 and the host 2. To be more specific, the host interface 31 functions for communication between the memory device 1 and the host 2 according to the communication protocol which is supported by both the memory device 1 and the host 2. In the case where the memory device 1 is the UFS memory device, the host interface 31 is, for instance, a UFS interface. The UFS interface accords with the M-PHY standard with respect to a physical layer, and accords with the UniPro standard with respect to a link layer.

The host interface 31 is connected to the buffer 32. The buffer 32 receives, via the host interface 31, data which has been transmitted from the host 2 to the memory device 1, and temporarily stores this data. In addition, the buffer 32 temporarily stores data which is transmitted from the memory device 1 to the host 2 via the host interface 31. The buffer 32 is connected to the data bus 33.

The I/O 23 is connected to the memory interface 34. The memory interface 34 executes a process which is necessary for the memory controller 12 to communicate with the memory 11. To be more specific, the memory interface 34 transmits an instruction from the core logic module 22 in such a form that the instruction can be recognized by the memory 11. When the memory 11 is a NAND flash memory, the memory interface 34 is a NAND flash interface.

The memory interface 34 is connected to the buffer 35. The buffer 35 receives, via the memory interface 34, data which has been transmitted from the memory 11 to the controller 12, and temporarily stores this data. In addition, the buffer 35 temporarily stores data which is to be transmitted from the controller 12 to the memory 11 via the memory interface 34. The memory interface 34 and buffer 35 are connected to the ECC (error correcting code) circuit 36. The ECC circuit 36 is connected to a data buffer 24. The ECC circuit 36 receives write data from the host 1 via the data bus 33, adds an error correcting code to the write data, and delivers the write data, to which the error correcting code has been added, to the buffer 35. In addition, the ECC circuit 36 receives data, which has been delivered from the memory 11, via the buffer 35, executes error correction of this data by using an error correcting code, and delivers the error-corrected data to the data bus 33.

The data bus 33 is connected to the control bus 41. The CPU (central processing unit) 42, ROM (read only memory) 43, RAM (random access memory) 45 and register 46 are connected to the control bus 41. The CPU 42, ROM 43, RAM 45 and register 46 communicate with each other via the control bus 41. The CPU 42 controls the overall operation of the memory device 1. The CPU 42 executes a predetermined process according to a control program (commands) stored in the ROM 43. The CPU 42 executes, for example, a predetermined process for the memory 11 according to commands which are received from the host 2 according to the control program.

The ROM 43 stores, e.g. a control program which is controlled by the CPU 42. The RAM 45 is used as a work area of the CPU 42, and temporarily stores, for instance, variables which are necessary for the work of the CPU 42. The register 46 stores various values which are necessary for the operation of the memory device 1. In addition, the register 46 stores various values which are necessary for the host 2 to control the memory device 2.

The host interface 31, buffer 32, memory interface 34 and buffer 35 are connected to the control bus 41. Based on the control program and instructions from the host 2, the CPU 42 controls the host interface 31, buffer 32, memory interface 34 and buffer 35. An analog port circuit 51 may be provided in the memory controller 12.

The memory device 1 may be, for example, an embedded-type memory device which is mounted on a printed circuit board by soldering, or a removable-type memory device which can be inserted in and detached from a card slot which is provided in the host 2.

FIG. 5 illustrates an example of the packaged memory device by, for example, sealing resin. As shown in FIG. 5, a plurality of memories 11 in chip-form are stacked on a printed circuit board 201. Each memory 11 is connected to a circuit pattern (not shown) on the printed circuit board 201 by wires 202. A memory controller 12 in chip-form is also disposed on the printed circuit board 201, and is connected to the circuit pattern by wires 202. For example, external terminals (e.g. BGA (ball grid array)) (not shown) are provided on a back side of the printed circuit board 201. The signals shown in FIG. 4 (RESET, REF_CLK, DOUT, DOUT_c, DIN, DIN_c, VCC, VCCQ, VCCQ2, VDDi, VDDi2, and VDDi3) are allocated to the external terminals. Signals are communicated between the memory device 1 and the host 2 on the outside of the memory device 1 via the external terminals. The printed circuit board 201, memories 11, memory controller 12 and wires 202 are packaged by, for example, a resin 203.

Figure 6:
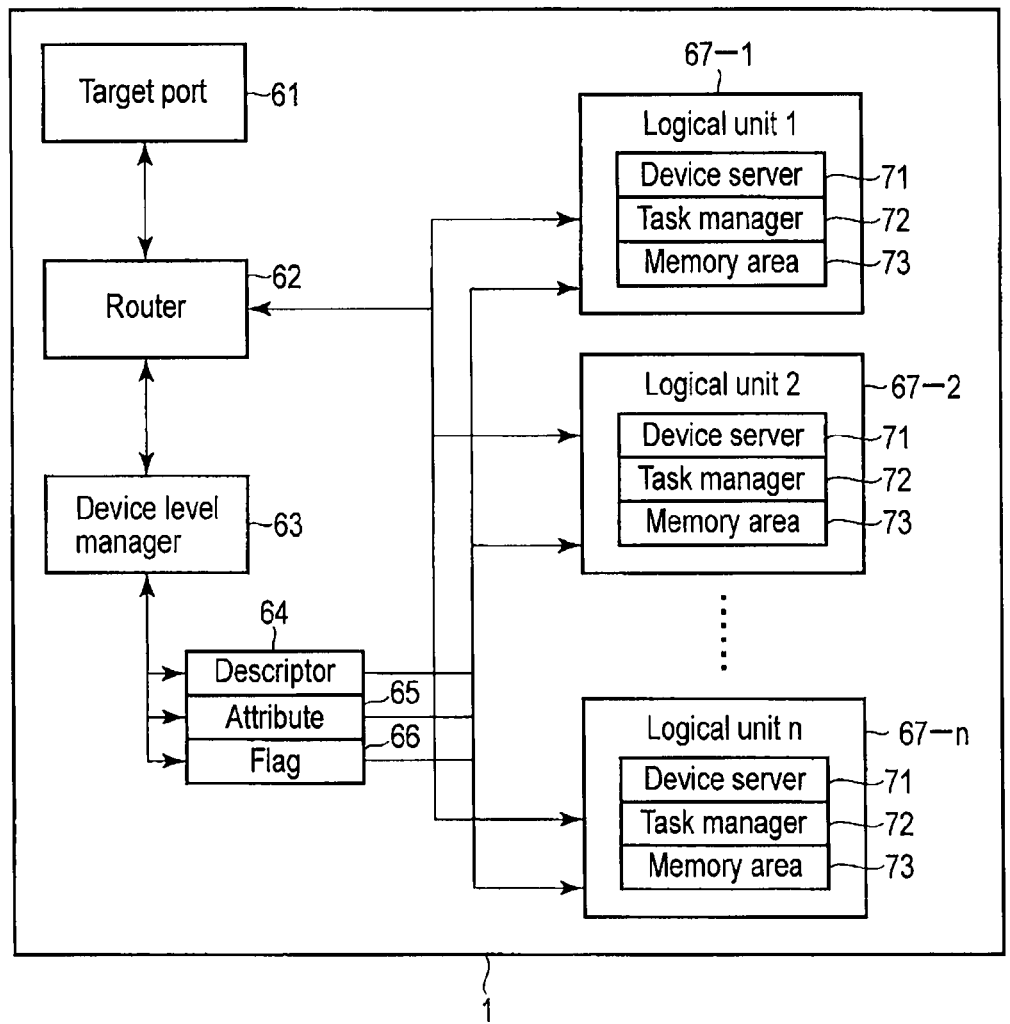
FIG. 6 is a view illustrating functional blocks of the memory device according to the first embodiment.

Next, FIG. 6 shows another aspect of the structure of the memory device 1. To be more specific, FIG. 6 shows a logical structure of the memory device 1, that is, functional blocks of the memory device 1. Each of the functional blocks can be realized by hardware, computer software, or a combination of hardware and computer software. Whether each functional block is to be executed as hardware or to be executed as software depends on a concrete mode of implementation or on design restrictions imposed on the entire system. A person skilled in the art may realize these functions by various methods in each concrete mode of implementation, but all methods for realization fall within the scope of the present invention. Besides, it is not imperative that the respective functional blocks are distinguished as in a concrete example which will be described below. For example, some functions may be executed by functional blocks which are different from the functional blocks illustrated in the description below. Furthermore, the illustrated block may be divided into functional sub-blocks. The embodiment is not restricted according to which blocks specify which functions.

The memory device 1 includes a target port 61, a router 62, a device level manager 63, a descriptor 64, an attribute 65, a flag 66, and a plurality of LUs (logical units) (67-1 to 67-n).

The target port 61 is a port by which the memory device 1 is communicably connected to the host 2. For example, the target port 61 corresponds to the host interface 31. The router 62 executes routing of a communication (e.g. task, command, data, or query) from the host 2 to a destination LU 67. The host 2 requests a command process or a task management function, by setting one LU 67 to be a destination.

Figures 7, 8:
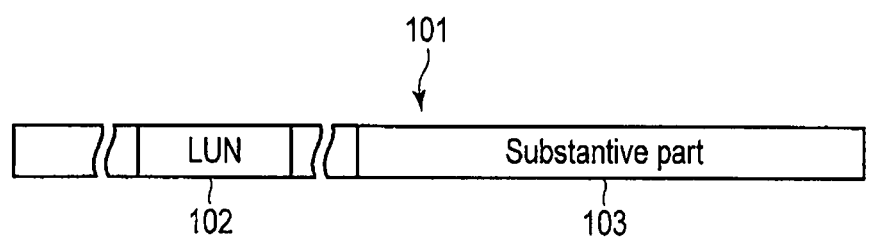
FIG. 7 is a view illustrating an example of a packet relating to the first embodiment.
FIG. 8 is a view illustrating an example of a conversion table of logical addresses and physical blocks.

The respective LUs 67 can mutually be identified by addresses (e.g. LUN (logical unit number)). For example, as shown in FIG. 7, the LUN can be included in a communication (packet) between the memory device 1 and the host 2. As shown in FIG. 7, a packet 101 includes a LUN 102 and a substantive part 103. The LUN 102 can be included in, for example, a header of the packet 101. The substantive part 103 includes contents which are unique to the function of the packet, such as a command, data or various parameters. The LU 62, which is the destination of each packet, is uniquely specified by the LUN. In the UFS memory device, each of packets between the memory device 1 and host 2 includes a header, and the LUN is described in the header.

The router 62 executes routing of a communication (task, command, data, or query), which has been received from the host 2, to the destination LU 67, based on the LUN included in the communication. In addition, the router 62 transmits communications, which are to be transmitted from plural LUs 67 to the host 2, to the target port 61 in a proper order, for example, by time division. The router 62 is realized by, for example, the CPU 42, ROM 43 and register 46. Specifically, the router 62 is realized by the program in the ROM 43 being executed by the CPU 42 with reference to the values in the register 46.

The device level manager 63 manages the operation and configuration of the device level. The management of the device level includes, for example, power management of the memory device 1, control of sleep, etc. The configuration of the device level includes, for example, retention of a set of descriptors. The device level manager 63 processes a command from the host 2, such as a change of configuration information of the memory device 1 or a query request that is an output request. The device level manager 63 is realized by, for example, the CPU 42, ROM 43 and register 46. Specifically, the device level manager 63 is realized by the program in the ROM 43 being executed by the CPU 42 with reference to the values in the register 46.

The descriptor 64, attribute 65 and flag 66 are realized, for example, as data in the work RAM 45. The descriptor 64 has a data structure of a pre-defined format, and describes a certain feature of the memory device 1. The descriptor 64 includes, for example, a device class, sub-class and protocol, which are necessary for accessing the memory device 1. The attribute 65 is a variable parameter or a read-only parameter, which is indicative of setting given to the memory device 1. The attribute 65 includes, for example, a maximum value of data which can be transferred between the memory device 1 and the host 2. The flag 66 includes a selective logical value for various items. For example, the flag 66 may be represent "true" or "false", or "0" or "1".

Each of the LUs 67 is realized by, for example, the memory 11, memory interface 34, buffer 35, ECC circuit 36, CPU 42, ROM 43 and register 46. Each LU 67 independently performs processing requested by the host 2. Accordingly, each LU is realized by part of resources provided by the memory 11, interface 31, buffer 35, ECC circuit 36, CPU 42, ROM 43 and register 46. As described above, the respective LUs are mutually distinguished one from another by the host 2, as described above by LUNs each identifying one LU. The command from the host 2 is executed by the designated LU 67.

Each LU 67 includes a device server 71, a task manager 72 and a memory area 73. The memory area 73 includes part of the memory area of the memory 11, and actually stores write data from the host 2. The device server 71 and task manager 72 are realized by, for example, the CPU 42, ROM 43 and register 46. Specifically, the device server 71 and task manager 72 are realized by the program in the ROM 43 being executed by the CPU 42 with reference to the values in the register 46. The device server 71 interprets and executes a command requesting a process of the LU level, which has been received from the host 2. Such a process includes, for example, data write, read, or erase. Since the LU 67 includes the memory area 73, the device server 71 has a function of controlling at least the memory area 73 (memory 11). The task manager 72 controls the order of execution of a plurality of commands (tasks), and provides a task management function.

As described above, the device server 71 executes a process relating to the control of the memory 11. Such a process includes conversion between a logical address and a physical address. The logical address is an address which is allocated by the host 2 to data which the host 2 desires to write in the memory device 1. The physical address, as described above, is an address for specifying a write area (page) or an erase area (block) of the memory 11. The device server 71 manages the state of storage of data by the memory area 73 corresponding to the device server 71 itself. The management of the storage state includes managing a relationship between a physical address of a page (or a physical block) and a logical address of data which is stored in this page, and managing which physical address is indicative of a page (or a physical block) that is in an erase state (a state in which no data is written or invalid data is stored). For this management, the device server 71 stores, for example, a logical address/physical address conversion table (hereinafter referred to simply as "conversion table" in some cases).

For example, as shown in FIG. 8, in an example of conversion, allocation may be made to blocks. A fixed logical address offset is allocated to each page of each block. FIG. 8 illustrates an example in which the size of a write unit of the memory 11 is 16 KB, and a logical address is allocated to each data of 512-Byte size.

Figure 9:
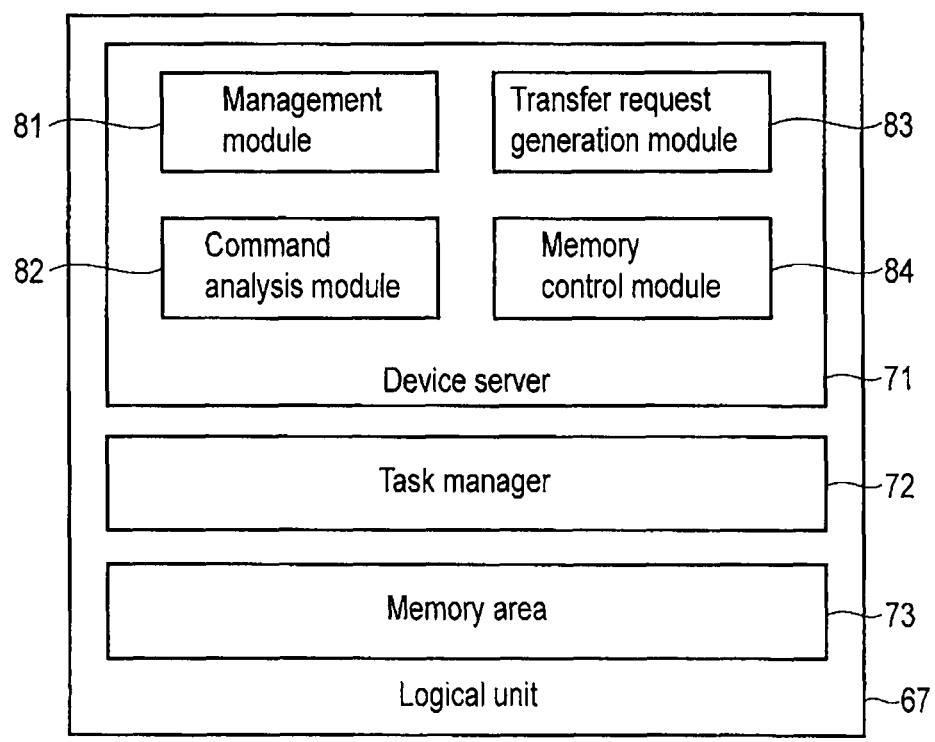
FIG. 9 is a view illustrating functional blocks, showing an LU (logical unit) in greater detail according to the first embodiment.

Next, referring to FIG. 9 and FIG. 10, an operation at a time of data write is described. FIG. 9 is a functional block diagram which illustrates the LU 67 of the first embodiment in greater detail. FIG. 10 illustrates communication at a time of data write in the first embodiment. Of the plural LUs 67, at least one LU, typically all LUs, have the structure which will be described with reference to FIG. 9. As shown in FIG. 9, the device server 71 includes a management module 81, a command analysis module 82, a transfer request generation module 83 and a memory control module 84.

The management module 81 manages the entirety of the device server 71. The command analysis module 82 receives a command from the host 2 via the router 62. The command analysis module 82 analyzes the received command. When the command analysis module 82 has received a write command, the command analysis module 82 requests the transfer request generation module 83 to determine (generate) a transfer request. The request to the transfer request generation module 83 may be executed directly by the command analysis module 82, or may be executed by the management module 81. Upon receiving the request, the transfer request generation module 83 generates a transfer request, based on the size and address of the write data included in the write command. The memory control module 84 functions to issue any kind of instruction to the memory 11, according to the instruction by the management module 81.

Next, referring to FIG. 10, a sequence at a time of data write is described. The present example relates to a data write request to one LU 67. Accordingly, each communication corresponds to a communication (packet) between the one LU 67 and the host 2.

As shown in FIG. 10, a write command is transmitted from the host 2 to the memory device 1. As illustrated in FIG. 11, the write command includes, at least, a LUN 102, a write instruction 111, an address 112, and a write data size 113. The address 112 is a position (logical address) at which write data is to be written. The write data size 113 is indicative of the size of the whole write data.

In a UFS memory system, all of data, a command and a query are transferred by packets. In the case where the memory device 1 and host 2 are the UFS memory system, the write command corresponds to a command transfer packet. The packet includes a header, and a command description part is included in a substantive part of the packet. A SCSI (small computer system interface) command is stored in the command description part. The SCSI command includes the write instruction 111, address 112 and write data size 113.

The write command is received by the command analysis module 82 in the destination LU 67. When the received command is the write command, the command analysis module 82 requests, directly or via the management module 81, the transfer request generation module 82 to generate a transfer request. Upon receiving the generation request, the transfer request generation module 82 generates a transfer request, taking into account the characteristics of the memory 11, specifically, the logical address and size of the write data. To be more specific, the transfer request generation module 83 checks whether the write request corresponds to a write request from the beginning of the page at the destination of write, by referring to the logical address of the write data. In this example, the logical address is 0x0000, which corresponds to the write request from the beginning of the block (i.e. page). Upon recognizing this, the transfer request generation module 83 requests the host 2 to transfer that part of the write data, which is equal to the size of one page. The reason for this is that the memory 11 executes data write in units of a page, and thus the data can be written efficiently if the memory 11 receives the data in units of a part (write data part) of the write data, which is equal in size to one page. Conversely, if the received data has a size which is 1.5 times larger than the size of one page, for example, a portion of the write data part needs to be temporarily stored in the buffer, and, for such a reason, it is possible that the efficiency of data write lowers. In this manner, if the write request corresponds to the write from the beginning of the destination page, the transfer request generation module 83 requests transfer of that data part from the beginning of the entire write data, which corresponds to the page size. To be more specific, in this example, a transfer request for the write data part of a 16 KB size from the logical address 0x0000 is generated. As shown in FIG. 10, this transfer request is sent to the host 2 via the management module 81 and router 62. In a second embodiment to be described below, a description is given of the case in which the write request does not correspond to a write request from the beginning of a page.

As shown in FIG. 12, the transfer request includes a LUN (header) 102, a transfer data address 121, and a transfer data size 122. The transfer data address 121 is indicative of an offset address of a write data part, the transfer of which is requested by the LU 62. The transfer data size 122 is indicative of a size of the corresponding write data part. In the case where the memory device 1 and host 2 are the UFS memory system, the transfer request corresponds to a transfer request packet. The transfer request packet indicates, in the substantive part of the packet, that the LU 62 has prepared for data transfer, and includes the transfer data address 121 and transfer data size 122.

As illustrated in FIG. 10, when the host 2 has received the transfer request, the host 2 transmits a write data part corresponding to the transfer request. As shown in FIG. 13, the data transfer includes a LUN (header) 102 and data 131. When the memory device 1 and host 2 are the UFS memory system, the data transfer is executed by a data transfer packet. The data transfer packet includes, in the substantive part of the packet, the data that is to be transferred.

The write data part from the host 1 is received by the memory device 2, to be more specific, by the LU 67 which has issued the corresponding transfer request. The received write data part is written at a proper position in the memory area 73 by the control of the memory control module 84.

Subsequently, the transfer request generation module 83 generates the next transfer request. This transfer request requests transfer of a data part of the page size, which follows the first write data part in the whole write data. This second write data part corresponds to the write data part of a 16 KB size from logical address 0x0020. The transfer request is transmitted to the host 2. Then, the corresponding data part is written in the memory area 73 in the same procedure as described with reference to the first data part.

Following the above, the same process is repeated. Specifically, the transfer request generation module 83 generates a request for transfer of a third write data part of the 16 KB size from logical address 0x0040, which follows the second write data part. Accordingly, the corresponding data part is written in the memory area 73. Further, the transfer request generation module 83 generates a request for transfer of the last write data part of the 16 KB size from logical address 0x0060, which follows the third write data part. Accordingly, the corresponding data part is written in the memory area 73. The size of the last write data part is also 16 KB. The reason for this is that the size of the write part is an integral multiple of the page size, and the write request corresponds to a request for write from the beginning of the page. If the transmission of the transfer request for the last write data part and the write of the data are completed, the device server (to be more specific, the management module 81) of the corresponding LU 67 transmits to the host 2 a response indicative of the success of data write. In this manner, the data write is completed.

As has been described above, the memory device according to the first embodiment is authorized to determine the size of each write data part which is to be transferred, in response to the data write request from the host 2. In addition, the memory device requests transfer of the write data part of the page size. Thus, the write data part, which is transferred at a time, has the page size, and the beginning and end of the write data part is matched with the beginning and end of the destination page. Thus, the memory device 2 can receive the next write data part, in parallel with writing the received write data part in the memory 11. While data is being written, the memory is in the busy state, and this is based on the fact that the memory 11 can receive write data. By this write sequence, the memory 11 can efficiently execute data write.

There is a memory which is configured such that in a page in which data is once written, it is prohibited to write data once again without erase the written data, regardless of whether data is already stored in a part in which data is to be written. In this memory, in the case where logical addresses and physical addresses are converted in a unit greater than the page size of the memory, the write efficiency lowers unless the write data part is transferred from the host 2 such that partial data write in the page may not occur. For example, as regards the conversion between logical addresses and physical addresses, it is assumed that logical addresses from 0x0000 to 0x0019 correspond to physical addresses of a first page of the memory 11, and logical addresses from 0x0020 to 0x0039 correspond to physical addresses of a second page of the memory 11. In this case, if a write data part of a 16 KB size from logical address 0x0010 is transferred from the host, the data from logical addresses 0x0010 to 0x0019 is stored in a half of the first page, and the data from logical addresses 0x0020 to 0x0029 is stored in a half of the second page. Thereafter, if the memory device receives a write data part of an 8 KB size from logical address 0x0000 from the host, since data rewrite in the first page is prohibited, it is necessary to read out the data of logical addresses 0x0010 to 0x0019 stored in the first page, and to store, in a new third page, this data together with the write data part of logical addresses 0x0000 to 0x0009 received from the host. After the write in the third page, the logical addresses from 0x0000 to 0x0019 are associated with the physical addresses of the third page of the memory 11. If partial write is executed in the page in this manner, the memory device has to copy the already written data to a new page, when the memory device has received from the host a write request for data write in a non-written part of the page. In addition, in the case where conversion between logical addresses and physical addresses is to be executed in units of a block of the memory, the already written data has to be copied to a new block in units of a block, and therefore the decrease in write efficiency becomes more conspicuous.

On the other hand, the write data part, which the memory device of the first embodiment requests the host 2 to transfer, has the page size, and the first logical address of the write data part corresponds to the first physical address of the page and the last logical address corresponds to the last physical address of the page. Thus, there occurs no partial write in the page, and the decrease in write efficiency due to the copy of already written data can be avoided.

<Data Division Determination Flow>

Next, referring to a flow in FIG. 14, a data division determination operation relating to the first embodiment is described. The memory device of the first embodiment executes data division determination according to the flow illustrated.

To start with, in step S11, the memory device 1 receives a write (WRITE) command from the host device 2. The write command is, for example, the above-described write command illustrated in FIG. 11.

Then, in step S12, the memory device 1 confirms the contents of all command queues in the received write command. Specifically, as shown in FIG. 11, the memory device 1 confirms the LUN 102, write instruction 111, address 112 and write data size 113 in the write command.

Subsequently, in step S13, the memory device 1 determines whether division of the data process is necessary or not. Specifically, the memory device 1 checks the number of write commands among the commands queued in the command queue of each logical unit (67), and determines whether the division of the data write process is to be executed or not, on the basis of the number of write commands. In the case of the present example, the criterion for determining whether the division is to be executed is as follows:

1. There are two or more write commands which are queued; and

2. The write size by each write command is one page or more.

If these two conditions are satisfied, the memory device 1 divides the write data, and executes data write. Although the details will be described later, in the case of the present example, the size of divided write data is a page unit. As shown in FIG. 15, one write command from the host device 2 is issued to one logical unit (LU).

Subsequently, in step S14, if it is determined in step S13 that the division of the data process is necessary (Yes), the memory device 1 executes data transfer with a divided size.

Then, in step S15, if it is determined in step S13 that the division of the data process is not necessary (No), the memory device 2 executes data transfer requested from the host device 2. In this case, the memory device 1 executes data write by maximizing the unit of write data (the page unit in this example). Accordingly, the data transfer efficiency can be enhanced.

<Concrete Example of Data Division Determination>

Next, referring to FIG. 15, the data vision determination operation relating to the first embodiment is described more concretely. FIG. 15 illustrates, by way of example, the case in which two write commands are issued from the host 1 to the logical unit 67-1 (LUN=1) and logical unit 67-2 (LUN=2), and the write command is divided into two in the above-described step S13.

As illustrated in FIG. 15, to start with, the memory controller 12 of the memory device 1 receives two write commands (1) and (2) to two logical units, i.e. logical unit 67-1 (LUN=1) and logical unit 67-2 (LUN=2), which have been issued from the host device (UFS HOST) 2.

Then, the memory controller 12 confirms all command queues of the received write commands (1) and (2).

Subsequently, the memory controller 12 determines whether the division of the data process of the received write commands (1) and (2) is necessary. In the case illustrated, the number of write commands among the commands queued in the command queue of each logical unit (67) is two or more ((1) and (2)), and the write size by each write command is one page or more.

Thus, the memory controller 12 determines that the received write commands (1) and (2) need to be divided.

Then, the memory controller 12 divides the received write command (1), (2) into two, and transmits, at first, a transfer request (Ready to Transfer LUN=1) of first-half divided write data for the logical unit 67-1 (LUN=1) to the host 2.

Responding to the received transfer request, the host device 2 transmits the first-half write data (Data Out UPIU LUN=1) for the logical unit 67-1 (LUN=1) to the memory controller 12.

Then, the memory controller 12 writes the received first-half write data in the corresponding logical unit 67-1 (Write (1) LUN=1). In this case, the size of the divided write data, which is written at a time by the memory controller 12, is a page unit basis. Thus, as viewed from the host device, the memory device 1 starts a busy (BUSY) period (1) from this time. The memory device 1 transmits "busy" (BUSY) to the host device 2.

As indicated by a broken-line box in FIG. 15, during the busy (BUSY) period (1) in which the memory controller 12 is accessing the logical unit 67-1 (LUN=1) for the data write, the memory controller 12 issues a request for first-half data for the logical unit 67-2 (LUN=2) that is the next target of data write, and receives write data from the host 2 in the same manner as described above.

Specifically, during the busy (BUSY) period (1), the memory controller 12 issues to the host device 2 a data transfer request (Ready to Transfer LUN=2) for data transfer to the logical unit 67-2 (LUN=2) that is the next target of data write, and similarly receives the write data from the host device 2 (Data Out UPIU LUN=2).

As described above, in the example illustrated, the access size to the memory device 1 is divided into two parts, i.e. a first half and a second half. At first, data write is executed in the logical unit 67-1 (LUN=1). While the first half is being written in the logical unit 67-1 (LUN=1), first-half write data for the next logical unit 67-2 (LUN=2) is requested, and the requested write data is received. Thereby, the efficiency of access to the memory device 1 can be enhanced, and the capability of response to the host device 2 can be improved.

Subsequently, when the first-half data write in the logical unit 67-1 (LUN=1) has been completed, the memory controller 12 can immediately write the write data (Data Out UPIU LUN=2), which has been received from the host device 2, in the corresponding logical unit 67-2 (LUN=2) (Write (1) LUN=2). The memory device 1 starts a busy (BUSY) period (2) from this time. The memory device 1 similarly transmits "busy" (BUSY) to the host device 2.

In the same manner as described above, during the busy (BUSY) period (2) in which the memory controller 12 is accessing the logical unit 67-2 (LUN=2) for the data write, the memory controller 12 issues a request for second-half divided data for the logical unit 67-1 (LUN=1) that is the next target of data write (Ready to Transfer LUN=1), and receives write data from the host 2 in the same manner as described above (Data Out UPIU LUN=1).

Subsequently, when the first-half data write in the logical unit 67-2 (LUN=2) has been completed, the memory controller 12 can immediately write the second-half write data, which has been received from the host device 2 (Data Out UPIU LUN=1), in the corresponding logical unit 67-1 (LUN=1) (Write (2) LUN=1). The memory device 1 starts a busy (BUSY) period (3) from this time. The memory device 1 similarly transmits "busy" (BUSY) to the host device 2.

In the same manner as described above, during the busy (BUSY) period (3) in which the memory controller 12 is accessing the logical unit 67-1 (LUN=1) for the second-half data write, the memory controller 12 issues a request for second-half divided data for the logical unit 67-2 (LUN=2) that is the next target of data write (Ready to Transfer LUN=2), and receives write data from the host 2 in the same manner as described above (Data Out UPIU LUN=2).

Subsequently, when the second-half data write in the logical unit 67-1 (LUN=1) has been completed, the memory controller 12 can immediately write the second-half write data, which has been received from the host device 2 (Data Out UPIU LUN=2), in the corresponding logical unit 67-2 (LUN=2) (Write (2) LUN=2). The memory device 1 starts a busy (BUSY) period (4) from this time. The memory device 1 similarly transmits "busy" (BUSY) to the host device 2.

When the write of the second-half write data (Data Out UPIU LUN=2) in the logical unit 67-2 (LUN=2) has been completed, the busy (BUSY) period (4) ends, and the memory controller 12 transmits "End" of the data write to the host device 2.

In the first embodiment, the case of the data write (Write) has been described by way of example. However, in the case of data read (Read), it should suffice if data is sent to the host 2 by dividing the data by a data size which is convenient for the memory device 1. Thus, in the case of data read, such a request for write data, as in the case of data write, is not issued.

<Advantageous Effects>

According to the memory device and the control method thereof relating to the first embodiment, at least the following advantageous effects (1) and (2) can be obtained.

(1) The efficiency of access to the memory device 1 can be enhanced and the capability of response to the host device 2 can be improved.

As has been described above, the memory controller 12 relating to this embodiment determines whether division of the data process is necessary or not. Specifically, the memory controller 12 checks the number of write commands among the commands queued in the command queue of each logical unit (67), and determines whether the division of the data write process is to be executed or not, on the basis of the number of write commands. In the case where the conditions for the division of the data write process are satisfied, the memory controller 12 divides the received write data and executes data write.

Specifically, in the case as illustrated in FIG. 15, the memory controller 12 determines that it is necessary to divide the received write commands (1) and (2). As a result, as indicated by the broken-line box in FIG. 15, during the busy (BUSY) period (1) in which the memory controller 12 is accessing the logical unit 67-1 (LUN=1) for the data write of the first-half data, the memory controller 12 issues the request for the first-half data for the logical unit 67-2 (LUN=2) that is the next target of data write, and similarly receives the write data from the host 2.

Specifically, during the busy (BUSY) period (1), the memory controller 12 issues to the host device 2 the data transfer request (Ready to Transfer LUN=2) for data transfer to the logical unit 67-2 (LUN=2) that is the next target of data write, and similarly receives the write data from the host device 2 (Data Out UPIU LUN=2).

In this manner, in this embodiment, the access size to the memory device 1 is divided into two, i.e. a first half and a second half. At first, the first-half data write is executed in the logical unit 67-1 (LUN=1). While the first-half data is being written in the logical unit 67-1 (LUN=1), the first-half write data for the next logical unit 67-2 (LUN=2) is requested, and the requested write data is received.

Figure 16:
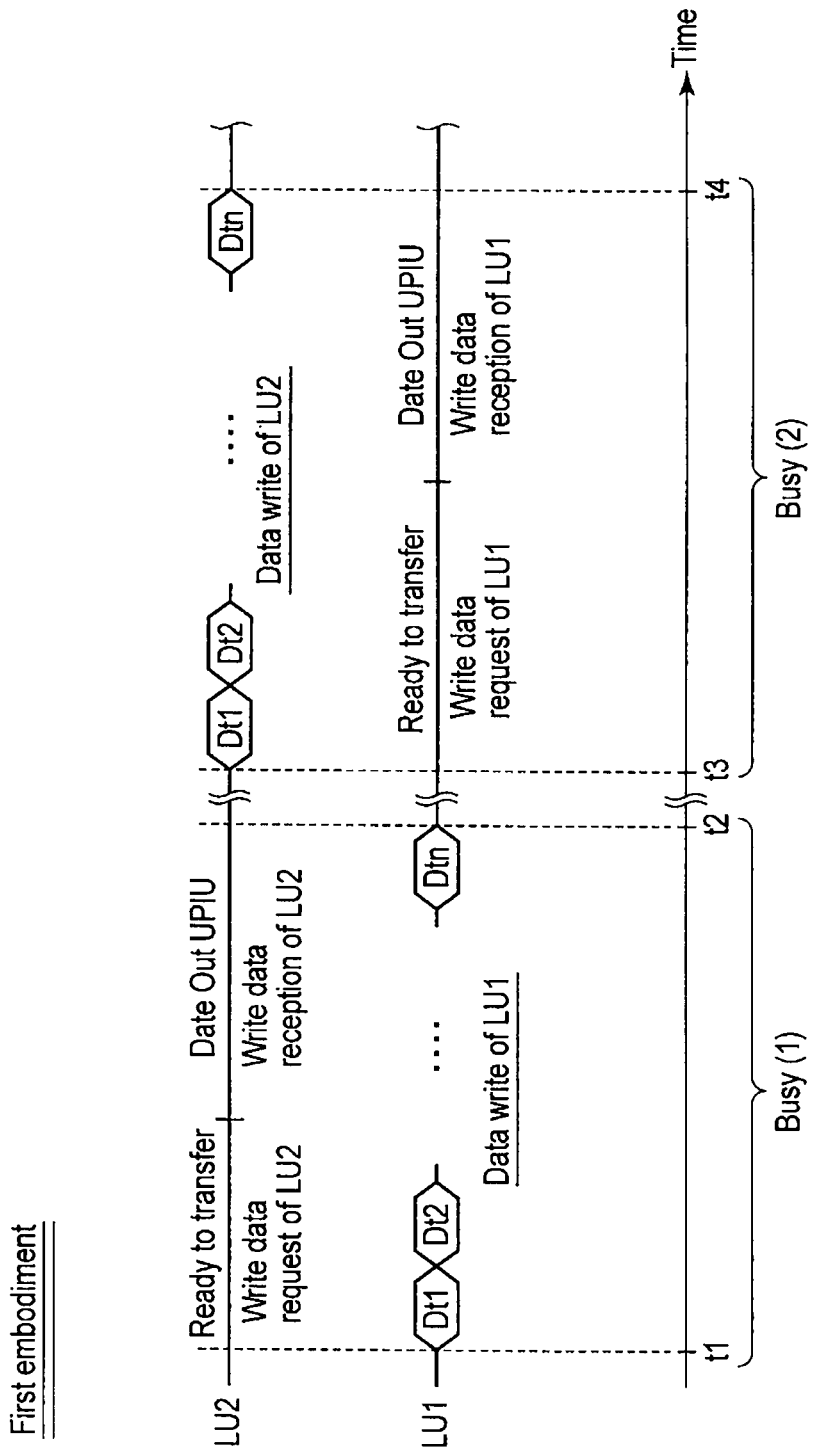
FIG. 16 is a view illustrating an access condition of two logical units in busy periods (1) and (2) in FIG. 15.

Thus, for example, as shown in FIG. 16, while the logical unit 67-1 (LUN=1) is being accessed for writing the first-half data (write data: Dt1 to Dtn) during the busy period (Busy (1)) between time point t1 and time point t2, it is possible to request, in a parallel fashion, the first-half data for the logical unit 67-2 (LUN=2) that is the next target of data write, and to receive the write data.

Accordingly, it is possible to immediately write the first-half data (write data: Dt1 to Dtn) in the logical unit 67-2 (LUN=2) during the busy period (Busy (2)) between time point t3 and time point t4. Similarly, during the busy period (Busy (2)), it is possible to request, in a parallel fashion, the second-half data for the logical unit 67-1 (LUN=1) that is the next target of data write, and to receive the write data.

Thereby, the efficiency of access to the memory device 1 can be enhanced, and the capability of response to the host device 2 can be improved.

As described above, for example, in the UFS standard relating to the present embodiment, the memory device 1 has an initiative in connection with the transmission/reception of data. Thus, in the present embodiment, by making use of this characteristic, data write is executed by a size of a page unit, thereby to improve the capability of access to the NAND flash memory, and the read process is divided. Thereby, the memory device 1 is prevented by being occupied by one process alone, and the access efficiency of the memory device 1 can be improved. In addition, the capability of response to the host device 2 can be improved.

In the UFS standard described in this embodiment, the host device 2 can independently issue commands to different logical units (LU) of the memory device 1. In addition, each partition can queue commands. It is necessary that the commands, which are issued to each partition, need to appear to operate independently, as viewed from the host device 2.

To overcome these restrictions, the command, which involves the access to the memory device 1, divides the access process to the NAND flash memory, in accordance with the internal state of the memory device 1. In the present embodiment, it is desirable that the unit of division is a page unit which is the maximum access unit to the NAND flash memory, or an erase block unit. The reason for this is that as the size of data write/data read access at a time becomes greater, the performance at the time of data write/data read in/from the NAND flash memory is more improved.

This being the case, in the present embodiment, in step S15, if the number of commands issued by the host device (Application Client) is small and the data division is needless, the data unit of access to the memory device 1 is maximized (the page unit in this embodiment), thereby enhancing the data transfer efficiency.

On the other hand, in step S14, if the number of issued commands is large, and the data division is necessary, the access unit to the memory device 1 is divided in order to enhance the capability of response to the host device 2.

(2) There are advantages not only in the NAND flash memory, but also in nonvolatile memories of the next generation.

The UFS standard is an interface standard corresponding to nonvolatile memories. It is assumed that a UFS memory device includes, for example, the NAND flash memory 11 and controller 12, which have been described in the present embodiment.

However, the UFS memory device may use not only the NAND flash memory 11 which has been described in the present embodiment, but also the next-generation nonvolatile memories such as a ReRAM (Resistance Random Access Memory) and an MRAM (Magnetic Random Access Memory).

Therefore, the embodiment is advantageous with respect to not only the NAND flash memory 11, but also the above-described next-generation nonvolatile memories.

[Second Embodiment (An Example Relating to, in Addition, a Read Command)]

Figure 17:
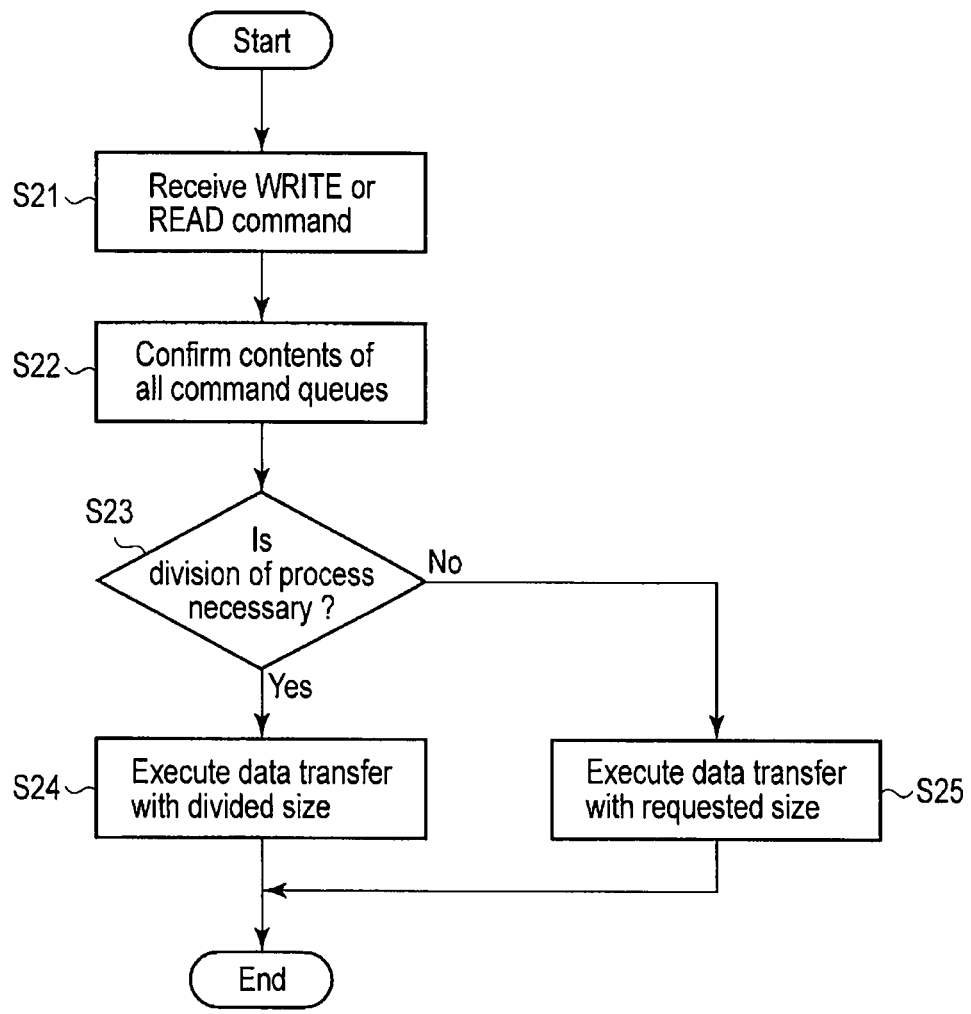
FIG. 17 is a view illustrating a data division determination flow of a memory device according to a second embodiment.

Next, referring to FIG. 17, a description is given of a memory device according to a second embodiment. The second embodiment relates to, in addition, a read command. A detailed description of parts common to those in the first embodiment is omitted.

<Data Division Determination Flow>

Referring to a flow in FIG. 17, a data division determination operation relating to the second embodiment is described.

To start with, in step S21, the memory device 1 receives a write (WRITE) command or a read (READ) command from the host device 2. In this respect, the second embodiment differs from the first embodiment.

Then, in step S22, the memory device 1 confirms the contents of all command queues in the received write command or the read (READ) command.

Subsequently, in step S23, the memory device 1 determines whether division of the data process is necessary or not. Specifically, the memory device 1 checks the number of write commands and read commands among the commands queued in the command queue of each logical unit (67), and determines whether the division of the data write process is to be executed or not, on the basis of the number of write commands and read commands. In the case of the present example, the criterion for determining whether the division is to be executed is as follows:

1. The total number of write commands and read commands which are queued is two or more; and
2. Each of the write size by each write command and the read size by each read command is one page or more.

If these two conditions are satisfied, the memory device 1 divides the write command/read command, and executes data write/data read. Similarly, the size of divided write data/read data is a page unit.

Subsequently, the same process as in the first embodiment is executed, and the data division determination is completed.

The other structures and operations are substantially the same as in the first embodiment.

<Advantageous Effects>

According to the memory device and the control method thereof relating to the second embodiment, at least the same advantageous effects (1) and (2) as described above can be obtained. Furthermore, as described in connection with the second embodiment, this embodiment can similarly be applied to the case of data read, where necessary, and the same advantageous effects can be obtained.

[Third Embodiment (An Example Relating to, in addition, a Query Request)]

Next, a memory device according to a third embodiment is described. In the third embodiment, determination is made by additionally taking into account a query request as a determination criterion. A detailed description of parts common to those in the first embodiment is omitted.

<Data Division Determination Flow>

Although illustration is omitted, in the above-described step S13, the memory device 1 determines whether division of the data process is necessary or not. Specifically, the memory device 1 checks the number of write commands and read commands among the commands queued in the command queue of each logical unit (67), and determines whether the division of the data write process is to be executed or not, on the basis of the number of write commands and read commands. In the case of the present example, the criterion for determining whether the division is to be executed is different from that in the above-described embodiment in that a query request (Query Request), for instance, is added, as follows:

1. The total number of write commands and read commands, which are queued, is one or more;

2. There is one or more query request (READ DESCRIPTOR/WRITE DESCRIPTOR) commands which are queued; and 3. Each of the write size by each write command and the read size by each read command is one page or more.

The query request (Query request) is mainly used in order to acquire information of the memory device 1. For example, the query request refers to a request from the host 2 for a change or an output of configuration information of the memory device 1. As regards the relationship between the query request and the above-described data transfer request, the process of the query request is preferentially executed since the process of the query request is a process of an inquiry and is shorter in processing time. As regards when a query request is to be executed in a write/read operation of divided data, a query process is executed as soon as a write/read process, which is being executed, has been finished.

If these three conditions are satisfied, the memory device 1 divides the write data/read data, and executes data write/data read. Similarly, the size of divided write data/read data is a page unit.

Subsequently, the same process as in the first embodiment is executed, and the data division determination is completed.

The other structures and operations are substantially the same as in the first embodiment.

<Advantageous Effects>

As described above, according to the memory device and the control method thereof relating to the third embodiment, at least the same advantageous effects (1) and (2) as described above can be obtained. Furthermore, as described in connection with the third embodiment, this embodiment can similarly be applied by adding the query request to the determination, where necessary, and the same advantageous effects can be obtained.

[Fourth Embodiment (An Example Relating to, in addition, a Read Command)]

Next, a memory device according to a fourth embodiment is described. A detailed description of parts common to those in the first embodiment is omitted.

<Data Division Determination Flow>

The priority of access can be set for the logical units 67.

The present embodiment differs from the foregoing embodiments in that, for example, in the above-described step S13 and the like, the division is not executed in the case of the access process to a logical unit 67 having a higher priority.

For example, the case is assumed that the logical unit 67-1 (LUN=1) has a higher priority than the logical unit 67-2 (LUN=2).

In this case, when two write commands (1) and (2) are issued from the host 1 to the logical unit 67-1 (LUN=1) and logical unit 67-2 (LUN=2), the memory controller 12 does not execute the above-described data division process, for example, in the above-described step S13. In this case, the memory controller 12 first executes the data write to the logical unit 67-1 (LUN=1) in connection with the write command (1).

<Advantageous Effects>

According to the memory device and the control method thereof relating to the fourth embodiment, at least the same advantageous effects (1) and (2) as described above can be obtained. Furthermore, the fourth embodiment can be applied, where necessary.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the above-described embodiments, the size of the write data part, which the memory device requests the host to transfer, is one page of the memory. However, the size of the write data part is not limited to one page, and may be an integral multiple of the page size. In addition, in the above-described embodiments, when the write request does not corresponds to a request for write from the beginning of the page, the data part corresponding to the size between the beginning of the write data and the end of the page at the destination of data write is requested as the first write data part. However, this data part corresponding to the size up to the end of the page at the destination of data write may be combined with subsequent data of the page size (or an integral multiple of the page size), and the combined data may be requested as the first write data part.

What is claimed is:

1. A memory device comprising:
   a nonvolatile memory in which data write or data read is executed in units of a plurality of cells; and
   a controller configured to control the nonvolatile memory and to manage a memory space of the nonvolatile memory by dividing the memory space into at least a first partition and a second partition,
   wherein the controller is configured to make the memory device receive a request for writing data to the first partition and a request for writing data to the second partition independently of each other,
   the controller determines, when a request for writing data has been received, whether to divide a data size of write data associated with the request, into the units of the plurality of cells,
   the controller divides the data size of write data when the controller determines to divide the data size of write data, and the controller issues a request for transmitting write data to the second partition and receive the write data for the second partition, during a period in which data writing to the first partition is being executed.

2. The device of claim 1, wherein the controller is configured to execute data read from the nonvolatile memory by dividing a data size of read data, when a data read request has been received.

3. The device of claim 1, wherein when the controller determines that division of the data size is unnecessary, the controller is configured to execute data write or data read in units of the plurality of cells, with the data size of the write data or read data being maximized.

4. The device of claim 1, wherein a unit of division of the data size is a unit of the plurality of cells by which the data write or data read is executed.

5. The device of claim 1, wherein as a criterion for the controller to determine whether division of the data size is necessary or not, the controller determines that the division of the data size is necessary when the following two conditions are satisfied:
   (1) a data write request or a data read request for at least the first partition and the second partition is issued; and
   (2) a data size of the data write request or the data read request is the unit of the plurality of cells or more.

6. The device of claim 1, wherein as a criterion for the controller to determine whether division of the data size is necessary or not, the controller determines that the division of the data size is necessary when the following three conditions are satisfied:
   (1) a data write request or a data read request for at least the first partition or the second partition is issued;
   (2) a least one or more query requests are issued; and
   (3) a data size of the data write request or the data read request is the unit of the plurality of cells or more, wherein the query requests are mainly used to acquire information of the memory device.

7. The device of claim 1, wherein when the first partition has a higher priority than the second partition, the controller is configured not to divide the data size of the write data and to execute data write of the first partition.

8. The device of claim 1, wherein the memory device is a memory device based on Universal Flash Storage (UFS).

9. A method of controlling a memory device including a nonvolatile memory in which data write or data read is executed in units of a plurality of cells, a memory space of the nonvolatile memory being divided into at least a first partition and a second partition, the method comprising:

receiving a request for writing data to the first partition and a request for writing data to the second partition independently of each other, determining, when a request for writing data has been received, whether to divide a data size of write data associated with the request, into the units of the plurality of cells, dividing the data size of write data when the data size of write data is determined to divide; and issuing a request for transmitting write data to the second partition and receiving the write data for the second partition during a period in which data writing to the first partition is being executed.

10. The method of claim 9, further comprising executing data read from the nonvolatile memory by dividing a data size of read data, when a data read request has been issued.

11. The method of claim 9, further comprising executing, when division of the data size is unnecessary, data write or data read in units of the plurality of cells, with the data size of the write data or read data being maximized.

12. The method of claim 9, wherein a unit of division of the data size is a unit of the plurality of cells by which the data write or data read is executed.

13. The method of claim 9, wherein as a criterion for determining whether division of the data size is necessary or not, it is determined that the division of the data size is necessary when the following two conditions are satisfied:
   (1) a data write request or a data read request for at least the first partition and the second partition is issued; and
   (2) a data size of the data write request or the data read request is the unit of the plurality of cells or more.

14. The method of claim 9, wherein as a criterion for determining whether division of the data size is necessary or not, it is determined that the division of the data size is necessary when the following three conditions are satisfied:
   (1) a data write request or a data read request for at least the first partition or the second partition is issued;
   (2) a least one or more query requests are issued; and
   (3) a data size of the data write request or the data read request is the unit of the plurality of cells or more, wherein the query requests are mainly used to acquire information of the memory device.

15. The method of claim 9, further comprising, when the first partition has a higher priority than the second partition, executing no division of the data size of the write data, and executing data write of the first partition.

16. The method of claim 9, wherein the memory device is a memory device based on Universal Flash Storage (UFS).

* * * * *